(12) United States Patent
Hoshino et al.

(10) Patent No.: US 6,372,392 B1
(45) Date of Patent: Apr. 16, 2002

(54) TRANSPARENT OPTICAL DEVICE AND FABRICATION METHOD THEREOF

(75) Inventors: Eiichi Hoshino; Masanori Onodera; Naoyuki Ishiwata; Kazumasa Doi; Mitsufumi Naoe, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/758,553

(22) Filed: Nov. 6, 1997

Related U.S. Application Data

(63) Continuation of application No. 08/473,967, filed on Jun. 7, 1995, now abandoned, which is a continuation of application No. 08/113,045, filed on Aug. 31, 1993, now abandoned.

(30) Foreign Application Priority Data

Sep. 7, 1992 (JP) ............................................. 4-237505

(51) Int. Cl.$^7$ .............................. G03F 9/00; C03C 15/00
(52) U.S. Cl. ............................................. 430/5; 216/67
(58) Field of Search ............................ 430/5, 321, 322, 430/323, 324; 216/79, 80, 67, 12, 66

(56) References Cited

U.S. PATENT DOCUMENTS 5,225,035 A * 7/1993 Rolfson ........................ 430/5
5,284,724 A * 2/1994 Noelscher et al. ............. 430/5
5,286,581 A * 2/1994 Lee ................................ 430/5

FOREIGN PATENT DOCUMENTS

JP          61-170702       * 1/1986

* cited by examiner

Primary Examiner—S. Rosasco
(74) Attorney, Agent, or Firm—Staas & Halsey LLP

(57) ABSTRACT

A transparent optical device is provided with a transparent medium having a front side, at least a portion of the front side being adapted for receiving light. A porous layer is formed on substantially all areas of the front side which are adapted for receiving light. The transparent optical device may have a recessed surface area which is recessed below a remainder area of the front side to define a phase shift photomask. The transparent medium may be made of synthesized silica. The porous layer may be formed by reactive ion etching using gaseous plasma of halogenized hydrocarbon. The front side of the transparent medium may have a portion not adapted for receiving light which may have a metal pattern formed thereon. In producing the transparent optical mask, the porous layer may be formed before or after the metal pattern. The transparent optical device may be formed in an etching chamber in which etching depth is monitored by measuring the transmissivity of a preselected portion of the transparent medium.

32 Claims, 11 Drawing Sheets

TRANSPARENT OPTICAL DEVICE AND FABRICATION METHOD THEREOF

This application is a continuation of application Ser. No. 08/473,967, filed Jun. 7, 1995, now abandoned, which is a continuation of application Ser. No. 08/113,045, filed Aug. 31, 1993, now abandoned.

FIELD OF THE INVENTION

The present invention relates to a transparent optical device and its fabrication method. More specifically, the present invention relates to a transparent optical device having a porous layer on a surface to improve its optical characteristics.

DESCRIPTION OF THE RELATED ART

Transparent optical devices, such as a photomask, an optical lens, an optical filter, an optical window, a prism, and a mirror, are, in many cases, fabricated by removing a damaged layer in the final processing step to obtain a mirror surface on a bulk substrate of the optical devices. This is particularly true for substrates having a high optical refractive index. The bare surface is usually coated by an antireflection layer. However, the conventional antireflection coating technique is not very useful for optical devices such as synthesized silica glass when this type of device is to be used with light in the deep ultraviolet wavelength region. The conventional coating is not very useful because synthesized silica glass has one of the lowest optical refractive indices in deep ultraviolet light among the widely used transparent optical materials, and a high energy photon of deep ultraviolet light often causes severe radiation damage to the antireflection layer which eventually decreases its optical transmissivity. This is known as a solarization effect.

In a phase shift photomask having a groove in the substrate surface in an area of either a main or a shifter pattern, which groove has been formed by dry etching in gaseous plasma of fluoro-hydrocarbon, it has been shown that a porous layer results in the groove and that the porous layer acts as an antireflection coating. However, the difference in transmissivity or reflectivity between areas which have been etched (main pattern) and those unetched (shifter pattern) by plasma gives rise to an undesirable optical interference at the boundary between the main and shifter patterns. Furthermore, higher transmissivity of the backside of the photomask reduces multi-reflection between the backside of the photomask and a highly reflective wafer surface, which can avoid an over-exposure of photoresist.

SUMMARY OF THE INVENTION

It is a primary object of the present invention to provide a transparent optical device having a porous layer on the surface of the substrate.

It is another object of the present invention to provide a method for fabricating a transparent optical device having a higher transmissivity in deep UV wavelength, without having to coat any foreign materials on the optical device.

It is still another object of the present invention to provide a transparent optical device in which an undesirable optical interference at a boundary between main and shifter patterns is minimized.

In experiments, an appreciable change was observed in optical transmissivity of deep ultraviolet light (UV) having a wavelength shorter than about 300 nm versus exposure time when a mirror-polished surface of a synthesized silica glass substrate was exposed to gaseous plasma of fluorohydrocarbon. In FIG. 1, three spectroscopic transmissivities are shown corresponding to three different exposure times: no exposure, 5 min. of exposure, and 10 min. of exposure, respectively. FIG. 1 indicates that the transmissivity increases for light below 300 nm in wavelength with increasing dry etching time, and that the transmissivity reaches a saturated value. This is due to the fact that a thin porous layer is formed on the bare surface of synthesized silica glass when the glass is exposed to gaseous plasma. This porous layer acts as an antireflection coating.

According to the present invention, there is provided a phase shift photomask having a synthesized silica substrate and a porous layer formed on both surface areas of the main and shifter pattern of the substrate by exposing these surface areas of the substrate to gaseous plasma of fluorohydrocarbon in a reactor chamber. By forming a porous layer on the both areas, the intensity of transmitted light is equalized at both sides between the main and shifter pattern, which produces a clear-cut pattern image for fine photolithography.

DESCRIPTION OF THE PREFERRED EMBODIMENTS

Figure 1:
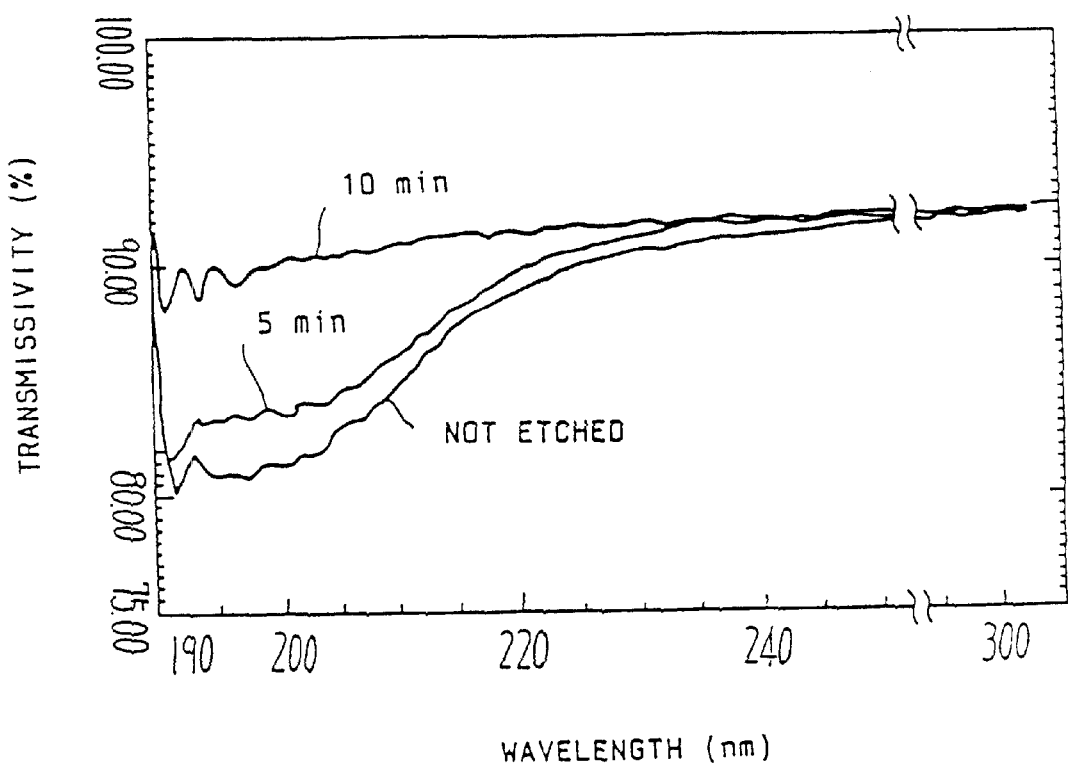
FIG. 1 is a diagram showing an optical transmission spectrum of a synthesized silica substrate in various degrees of dry etching related to the first embodiment according to the present invention.

The preferred embodiments of the present invention will now be described in detail with reference to the appended drawings. In the drawings, like reference numerals denote like elements, and therefore a redundant description thereof is omitted, where appropriate.

Figure 2A:
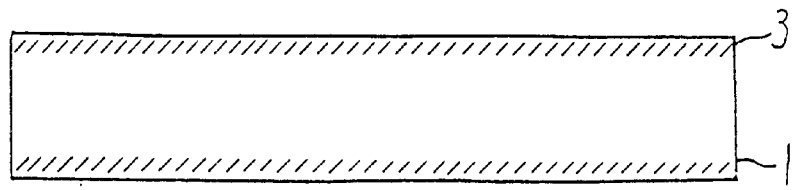
FIGS. 2A through 2C are cross-sectional views of a chromeless type phase shift photomask in various steps of a fabrication process related to the first embodiment according to the present invention.
Figure 2B:
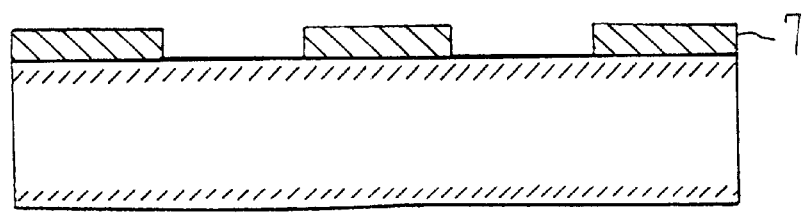
Figure 2C:
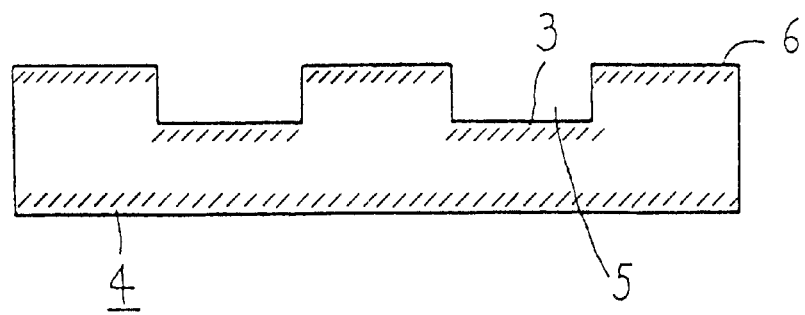

FIGS. 2A through 2C show steps of a fabrication process for a chromeless type phase shift photomask related to the first embodiment according to the present invention.

A 12.5 mm square, 2.3 mm thick substrate 1 made of mirror-polished synthesized silica glass is provided. The substrate 1 is dry etched uniformly to form a porous layer 3 having a depth a about 400 nm on each of a first and a second (front and back) surface, as shown in FIG. 2A. The dry etching process will be described in detail later. As shown in FIG. 2B, an 85 nm thick chrome-oxide sandwiched chrome layer is grown over the first surface of the glass substrate by sputtering and is patterned. Then, as shown in FIG. 2C, a 389 nm deep groove is selectively formed in an area to become a main pattern 5. The groove is formed by anisotropic dry etching with the chrome-oxide sandwiched chrome mask 7. Stripping off the chrome mask 7 gives a chromeless type phase shift photomask 4 wherein both the area of the main pattern and the area of a shifter pattern, both on the first surface, are porousized. Also, the second surface, or back side, of the substrate is porousized.

Figure 3:
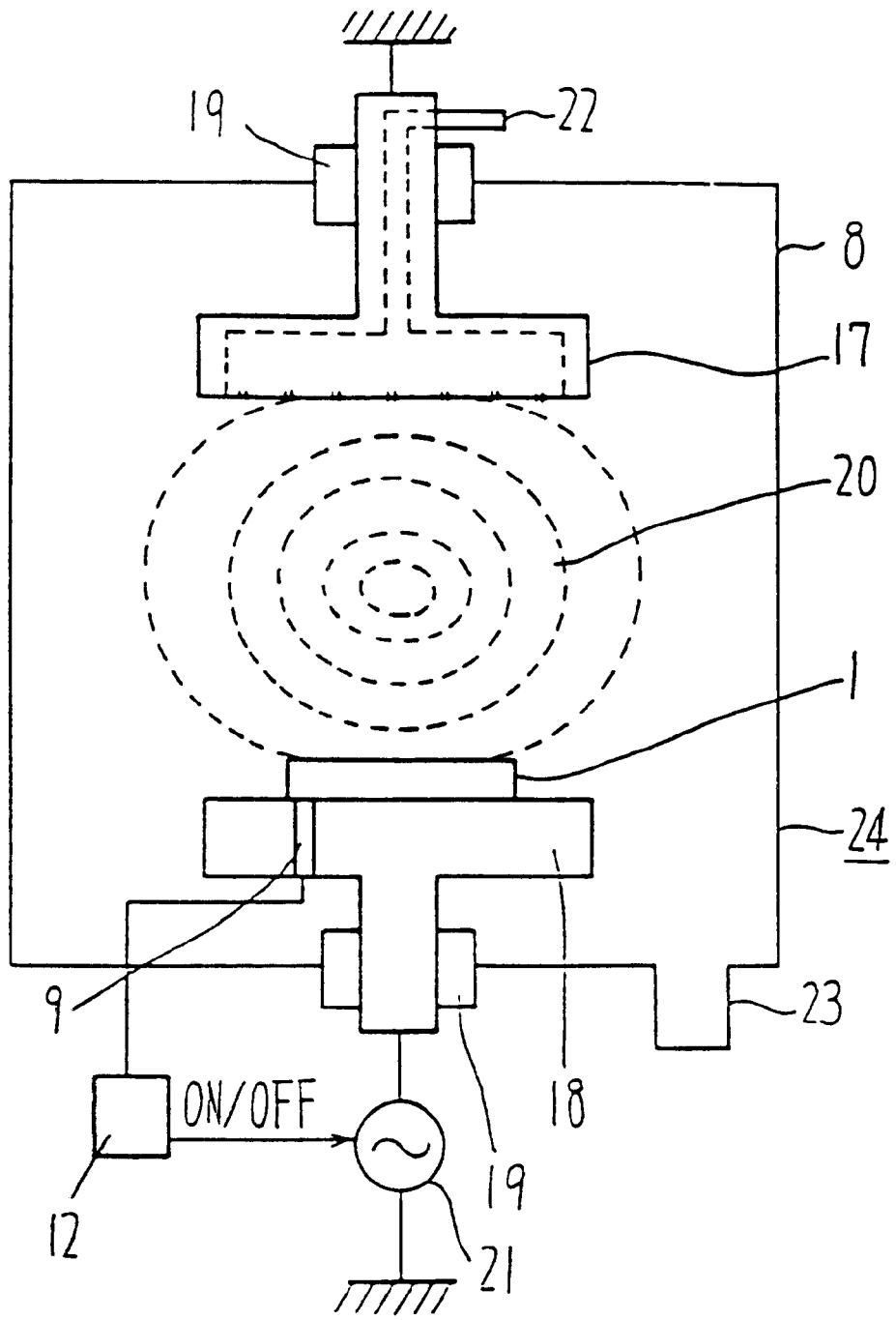
FIG. 3 is a schematic diagram showing an etching monitoring system assembled in a dry etching apparatus related to the second embodiment according to the present invention.
Figure 4:
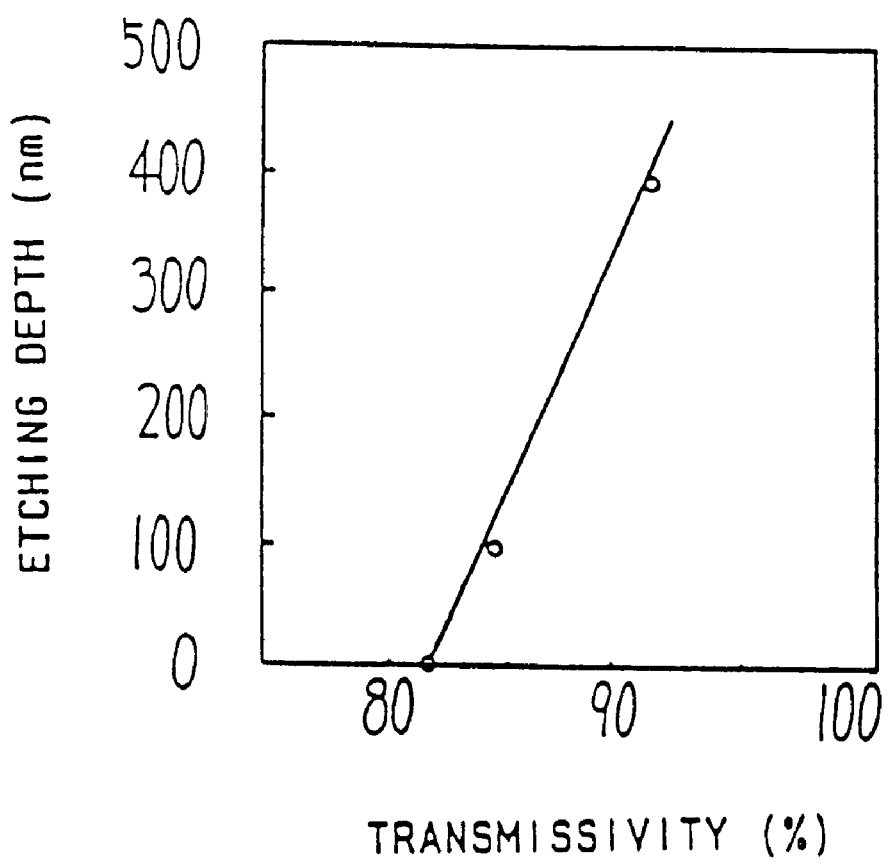
FIG. 4 is a diagram showing a calibration curve between etching depth and transmissivity as measured from a control sample.

Referring to FIG. 3, an etching monitoring system assembled in a dry etching apparatus and related to the second embodiment according to the present invention is illustrated. The dry etching apparatus 24 is a conventional cathode coupled parallel plate reactive etching system. A chamber 8 is evacuated from outlet 23 by a vacuum pump, not shown. Teflon rings 19 serve as a vacuum seal and as electric insulation from the chamber. Etching gas (Fluorohydrocarbon or Flon 14) is uniformly introduced from inlet 22 at a rate of 100 sccm, by way of a gas diffuser. During etching of a synthesized silica glass, the gas is usually kept at a pressure of 0.11 Torr (1 Torr=133.322 Pa). Also during etching, a microwave having a frequency of 13.5 MHz and a power of 200 W is applied between a cathode plate 18 and an anode plate 17 which are parallel to each other. The microwave is applied by a high-frequency oscillator 21. For approximately 26 minutes, the substrate on the cathode plate is exposed to radicals of florin F* from gaseous plasma 20 accelerated along an electric field normal to the substrate surface, which results in anisotropic etching to a thickness of about 400 nm. To control etching thickness precisely, the optical transmissivity of the substrate is measured in situ by detecting deep UV light emitted from the plasma. The etching monitoring system mainly consists of an optical fiber 9 and a photoelectric sensing system 12, as shown in FIG. 3. The deep UV light from the plasma which is transmitted through the substrate is received by an optical fiber 9 installed in the cathode plate 18 and detected by photoelectric sensing system 12 which is outside the chamber. The photoelectric sensing system 12 feeds back a control signal to the oscillator 21. A calibration curve between etching depth and optical transmissivity (etching depth vs optical transmissivity) used for the above measurement is shown in FIG. 4.

Figure 5A:
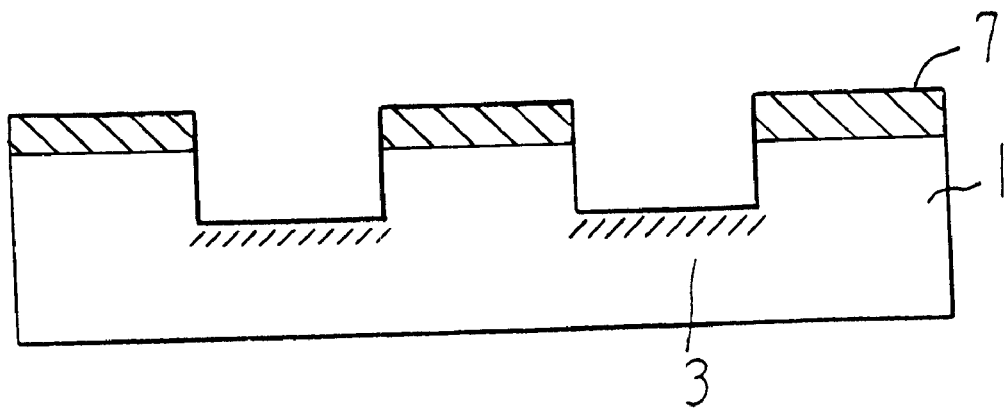
FIGS. 5A and 5B are cross-sectional views of a chromeless type phase shift photomask in various steps of a fabrication process related to the third embodiment according to the present invention.
Figure 5B:
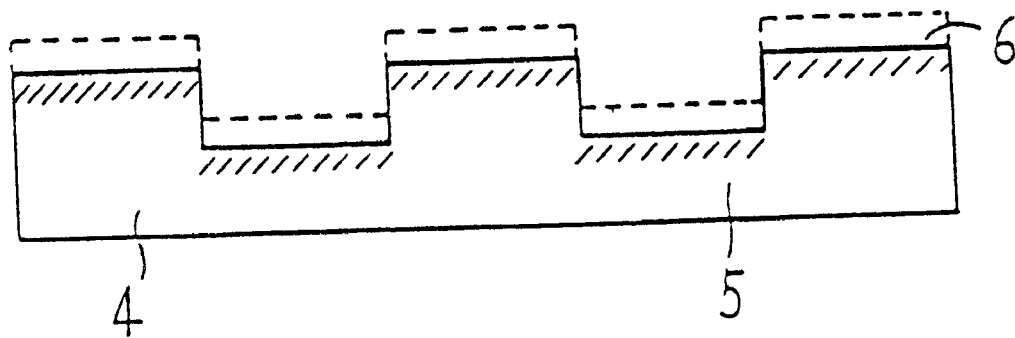

Referring to FIGS. 5A and 5B, fabrication processing steps for a chromeless phase shift photomask are shown related to third embodiment according to the present invention. The patterned chrome mask 7 is used to form a groove with a porous layer 3 on the etched surface by dry etching the substrate 1. Next, after removing the chrome mask 7, the entire surface of the substrate is dry-etched to form a porous layer both on the main pattern 5 and the shifter pattern 6. The substrate material, geometry, dry-etching conditions and etching monitoring method for the third embodiment are all the same as those for the first embodiment except for order of the processing steps. This is also true for the fourth and fifth embodiments to be described as follows.

Also, the entire surface of the backside is covered with a porous layer, deep UV light traveling through both the front and back surfaces in a process of photolithography for semiconductor wafers.

Figure 6A:
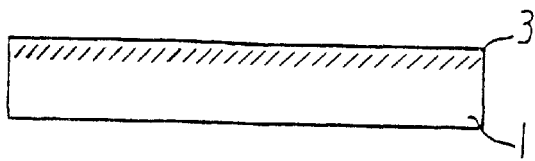
FIGS. 6A through 6I are cross-sectional vies of an edge-enhanced type phase shift photomask in various steps of a fabrication process related to the fourth embodiment according to the present invention.
Figure 6B:
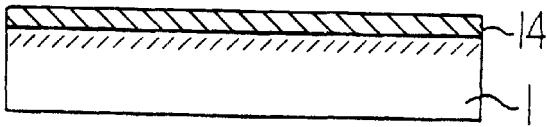
Figure 6C:
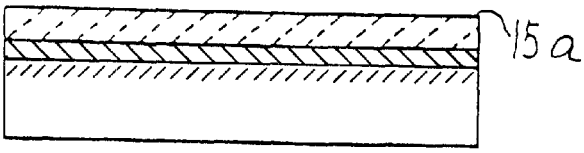
Figure 6D:
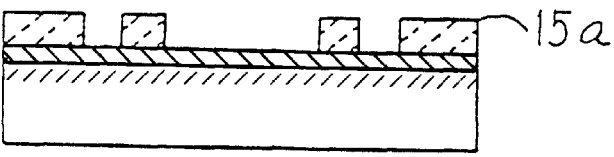
Figure 6E:
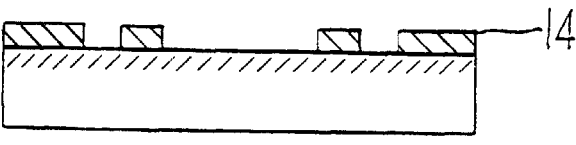
Figure 6F:
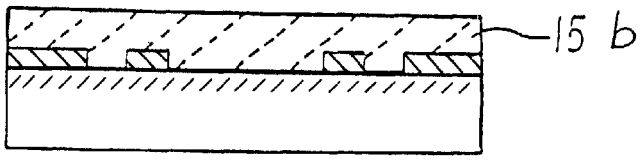
Figure 6G:
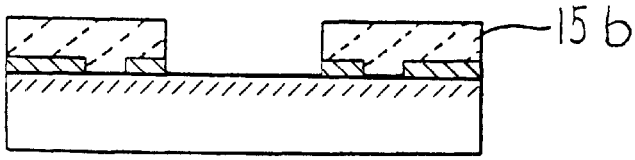
Figure 6H:
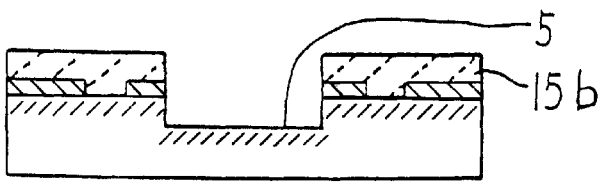
Figure 6I:
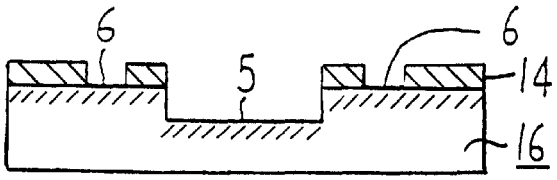

Referring to FIGS. 6A through 6I, various steps of fabricating an edge-enhanced (or edge stepper) type phase shift photomask related to the fourth embodiment, according to the present invention, are described hereunder. The steps shown in FIGS. 6A through 6D are substantially the same as those in FIGS. 2A and 2B. In FIG. 6A, substrate 1 made of mirror-polished synthesized silica glass is dry-etched uniformly to form a porous layer 3 on each of the front surfaces. The porous layer 3 may also be formed on the back surface. Then, as shown in FIG. 6B, a chrome mask 14 is formed on the front surface. A first photoresist 15A is deposited on the chrome mask 14 (FIG. 6C) and is exposed and developed (FIG. 6D) to define a mask for selectively removing chrome mask 14 (FIG. 6E). The first photoresist 15a is then removed and a second photoresist 15B is deposited (FIG. 6F). The second photoresist 15B is exposed and developed to define a mask for selectively forming a groove. The groove is formed on the front surface of the glass substrate in an area to become the main pattern 5 by using electron beam lithography and reactive ion etching technique. Thus, an edge-enhanced type phase shift photomask 16, having a main pattern 5 and a shifter patter 6, is completed. It is clear that the surface of shifter pattern 6 is covered with a porous layer, as is that of the main pattern 5. Reiterating, the entire surface of the backside may also be covered with a porous layer (not shown), as deep UV light travels through both the front and back surfaces in a process of photolithography for semiconductor wafers.

Figure 7A:
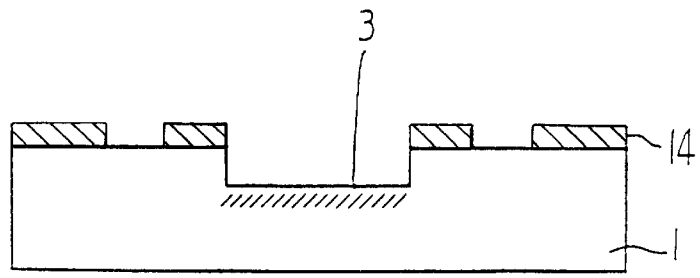
FIGS. 7A and 7B are cross-sectional views and FIG. 7C is a plane view of an edge-enhanced type phase shift photomask in various steps of a fabrication process related to the fifth embodiment according to the present invention.
Figure 7B:
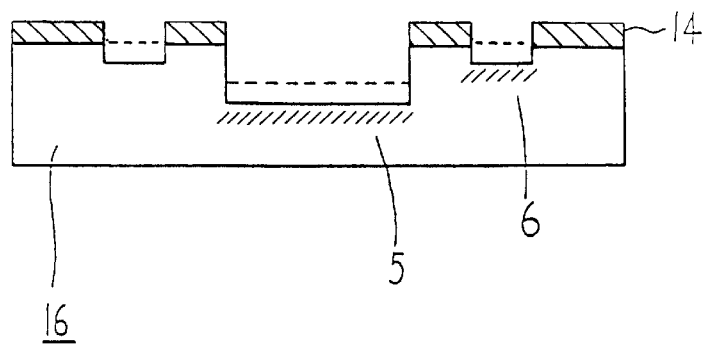
Figure 7C:
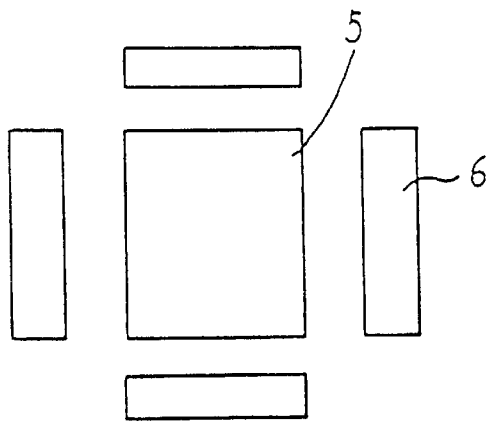

FIGS. 7A and 7B are cross-sectional views and FIG. 7C is a plane view of fabricating steps for an edge-enhanced type (or edge stepper type) phase shift photomask 16 related to the fifth embodiment according to the present invention. A chrome pattern and a groove in this embodiment are formed substantially in the same manner as those in the fourth embodiment, except that the entire front surface of the glass substrate is not dry-etched prior to the step of depositing the chrome layer 14. The fifth embodiment is similar to the third embodiment in this regard. After patterning the chrome layer 14, additional dry-etching on the surface of both main pattern 5 and shifter pattern 6 is carried out as shown FIG. 7B. This equalizes optical characteristics. FIG.7C shows a plane view of the edge-enhanced type phase shift photomask corresponding to FIG. 7B, wherein a difference in groove depth between the main pattern 5 and the shifter pattern 6 is adjusted to odd multiples of half a wavelength.

Figure 8:
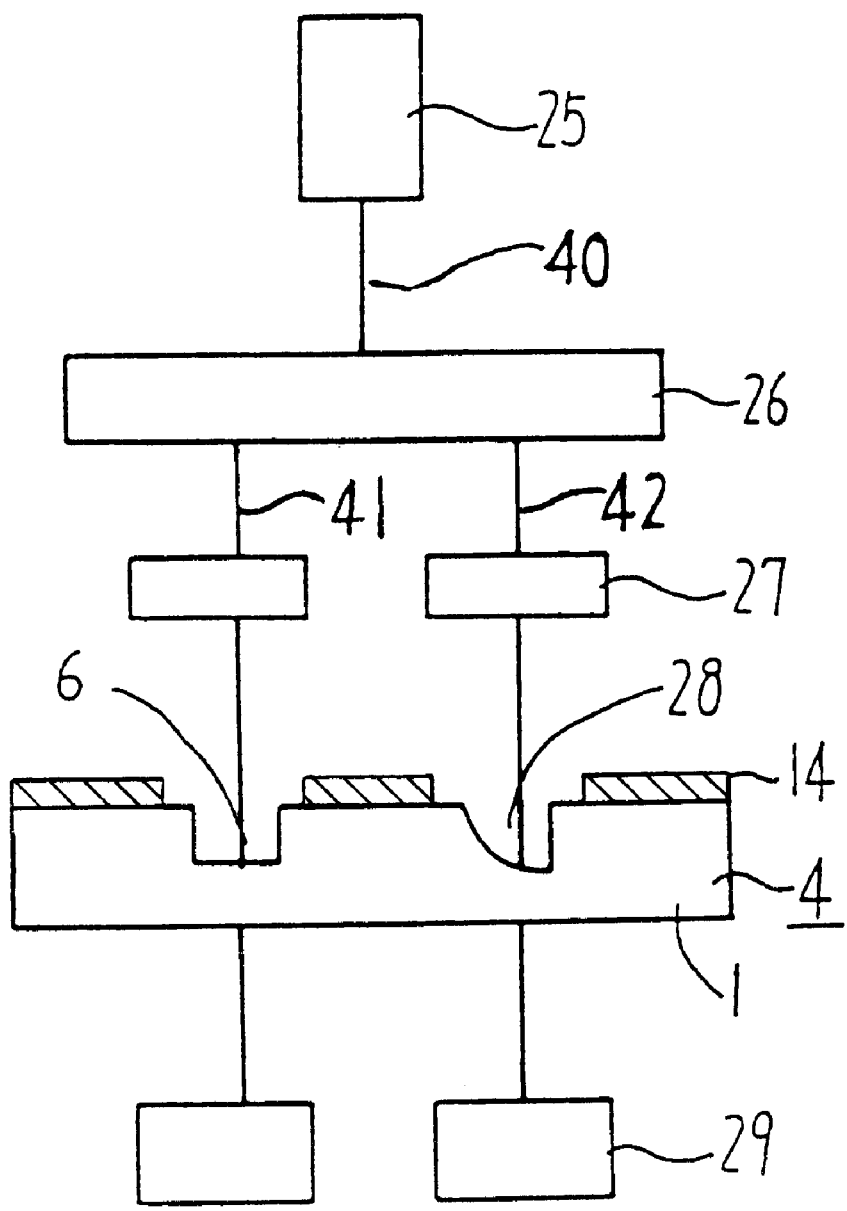
FIG. 8 is a schematic diagram showing a first method of inspecting the shifter pattern in a photomask related to the sixth embodiment according to the present invention.
Figure 9A:
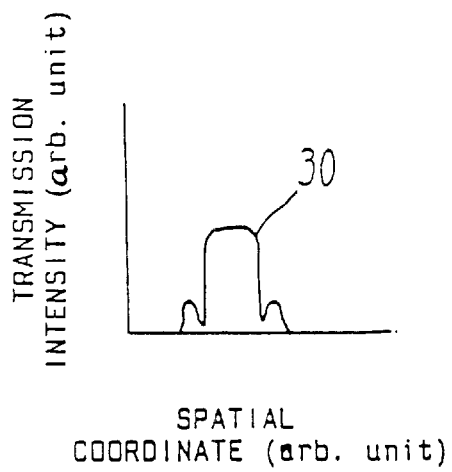
FIGS. 9A through 9C are schematic diagrams showing the transmitted beam intensity profile across the shifter pattern related to the sixth embodiment according to the present invention.
Figure 9B:
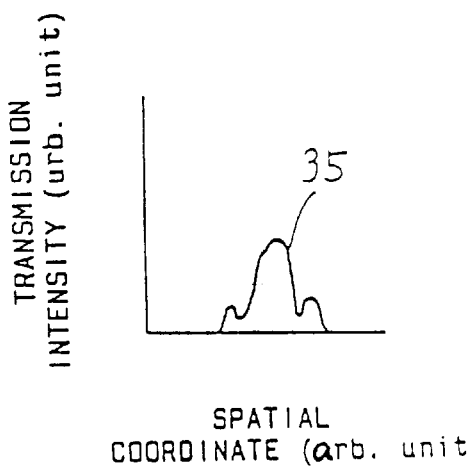
Figure 9C:
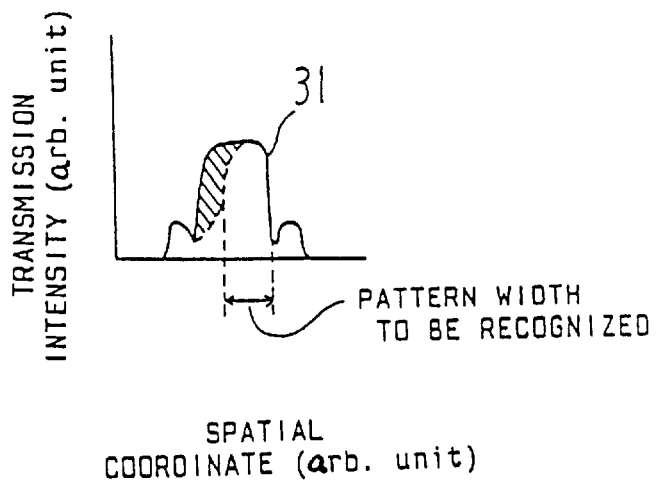

Referring to FIGS. 8 and 9A through 9C, a first method for inspecting a pattern defect in a photomask related to the sixth embodiment according to the present invention is described. FIG. 8 is a schematic diagram showing the first method for inspecting a defect of the shifter pattern in a photomask by comparing a transmitted beam profile of each measured pattern with that of a control pattern. A light source 25 emitted light having a wavelength shorter than 300 nm in length, for example, a KrF laser (248 nm), an ArF laser (198 nm), or a deep UV lamp with an optical filter is used for inspecting a mask. A beam 40 from the light source 25 is divided in two by beam splitter 26. Then each split beam is focused on a phase shift photomask 4 by a pair of lenses 27, wherein one split beam (the left-hand side) 41 is transmitted through a perfect shifter pattern 6 and another (the right-hand side) 42 is transmitted through an imperfect pattern 28 which is to be inspected. Each of the two transmitted beams is sensed by a pair of photo-detectors 29. Complete two-dimensional defect information on the mask pattern can be obtained by scanning in the X-Y direction, the pair of beams relative to the photomasks. Spatial profiles of transmissivity 30 and 35 across perfect and imperfect shifter patterns 6 and 28 are respectively shown in FIGS. 9A and 9B. For simplicity, FIG. 9C shows an optically synthesized spatial profile 31, wherein the difference in transmission intensity between the perfect and imperfect patterns is indicated in arbitrary units by a shaded area. By detecting this difference, one can see etching residue for a pattern width of a particular groove. In the actual procedure, the electric output signals from the photo-detectors 29 are digitally processed to compare the perfect and imperfect profiles with each other.

Figure 10B:
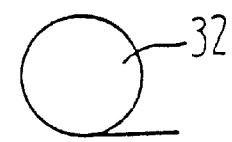
FIG. 10B is a schematic diagram showing a magnetic tape related to the seventh embodiment according to the present invention.
Figure 10A:
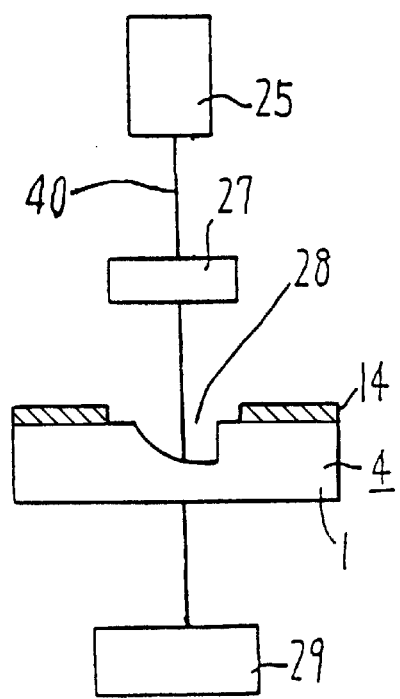
FIG. 10A is a schematic diagram showing a second method of inspecting the shifter pattern in a photomask related to the seventh embodiment according to the present invention.
Figure 10C:
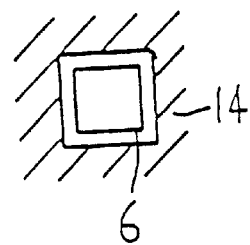
FIG. 10C is a plane view of a shifter pattern stored on the magnetic tape of FIG. 10B related to the seventh embodiment according to the present invention.
Figure 11A:
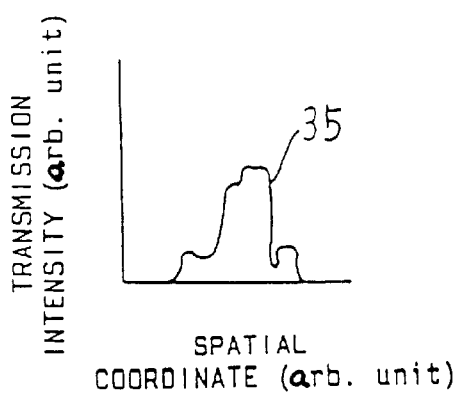
FIGS. 11A through 11C are schematic diagrams showing the transmitted beam intensity profile across the shifter pattern related to the seventh embodiment according to the present invention.
Figure 11B:
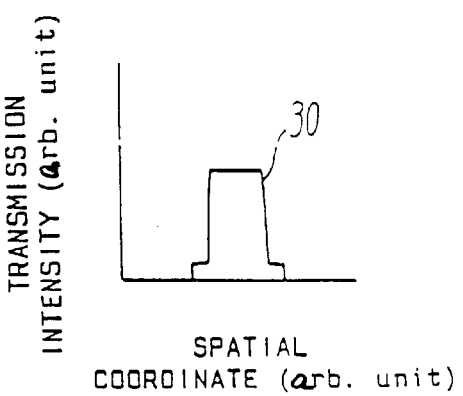
Figure 11C:
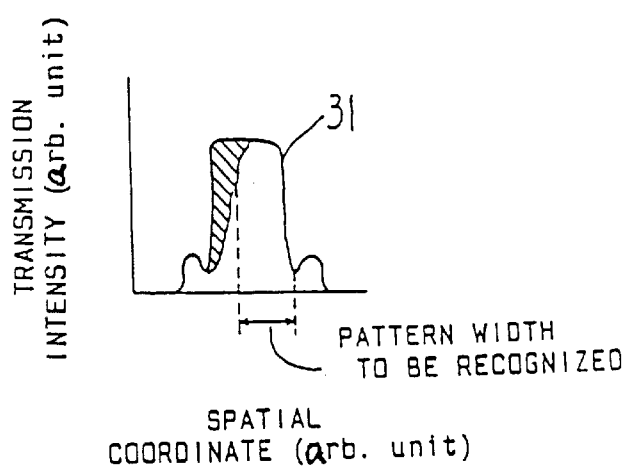

Referring to FIGS. 10A through 10C and 11A through 11C, the second method for inspecting a pattern in a photomask related to the seventh embodiment according to the present invention is described. In this method, the electric output signal of a spatial profile to be inspected is compared to that of the control sample which has been previously recorded on magnetic tape. As shown in FIG. 10A, almost in the same manner as in FIG. 9, a deep UV beam 40 from a light source 25 is focussed by lens 27 on shifter pattern 28 of phase shift photomask 4, the shifter pattern 28 having an imperfect groove. Like FIG. 9, the transmissivity is detected by photo-detector 29. The photo-detector 29 comprises an area sensor of charge-coupled device (CCD) to catch two-dimensional image data with multi-step gray scales. Electric data from photo-detector 29 is immediately compared to that of a perfect shifter pattern, which is stored in a magnetic tape 32 (see FIG. 10B). A plane view of the perfect shifter pattern is shown in FIG. 10C. Reference numerals 35 and 30 in FIGS. 11A and 11B, respectively, show the spatial profile of transmission intensity for the measured shifter pattern having a defect and that for the perfect shifter pattern recorded in the magnetic tape, respectively. FIG. 11C shows a spatial profile 31 synthesized from the measured and recorded shifter patterns, wherein the difference in transmission intensity between the two is indicated by a shaded area. The shaded area shows that the pattern width is smaller than the normal, and therefore, the groove should be repaired by additional etching.

Although the invention has been described in detail with regard to fabrication on a phase shift photomask, it should be noted that the invention should not be limited to this optical device. Another example of an optical device to which the invention may be applied is an ordinary photomask, an optical lens, an optical filter, an optical window, a prism, or a mirror for deep UV wavelength light. In each of these optical devices, as in the phase shift photomask, a porous layer is formed on the surfaces on which a photon beam is incident, reflected, or transmitted. The porous layer acts as an antireflection layer and therefore decreases loss of the effective beam at the interface between the optical device and the adjoining space (either gas or vacuum), as mentioned before. It should be also recognized that the method for fabricating the porous layer in the invention is not limited to etching with a plasma of fluorohydrocarbon (or Flon 14). Other methods for fabricating the porous layer are possible, such as exposure to accelerated ions extracted from a plasma of a different halogenized hydrocarbon (such as a chloro-hydrocarbon) to thereby etch the surface. Alternatively, the porous layer can be fabricated by exposure to non-etching gases such as an inert gas, for instance, argon. The non-etching gases are preferable when fabricating an optical device in which the surface should not be etched during the porousizing process, such as a multi-layered mirror or some grating. Although the exact process of how the porous layer is formed is not clear, it may be through breaking silicon-silicon bonds by accelerated particles, either chemically or physically. Furthermore, it is possible to form a porous layer on the surface of an optical material other than synthesized silica glass by a proper amount of exposure. For example, sapphire and organic plastics exposed to accelerated particles from a gaseous plasma will become porousized. Oxygen containing plasma is particularly effective in etching and porousizing many organic glasses such as polymethylmethacrylate (PMMA), or polyvinylchloride (PVC).

What is claimed is:

1. A transparent optical device, comprising:
a transparent medium which generally extends in a first plane, the transparent medium having front and back opposing sides, the front side being adapted for receiving light and including at least one plasma irradiated surface portion generally extending parallel to the first plane, substantially the entire surface area of the front side generally extending parallel to the first plane being plasma irradiated, wherein at least the front side is porous.

2. The transparent optical device according to claim 1, wherein the back side of the transparent medium has a plasma irradiated surface portion.

3. The transparent optical device according to claim 1, further comprising a metal pattern for reflecting light formed on the back side.

4. The transparent optical device according to claim 1, wherein the transparent medium is made of at least one material selected from a group consisting of synthesized silica glass, glass containing silica, crystalline quartz, sapphire and organic glass.

5. A method of producing a transparent optical device, comprising:
(a) providing a transparent medium which generally extends in a first plane, the transparent medium having front and back opposing sides, the front side being adapted for receiving light; and
(b) forming at least one plasma irradiated surface portion generally extending parallel to the first plane, substantially the entire surface area of the front side generally extending parallel to the first plane being plasma irradiated, wherein at least the front side is porous.

6. The method of producing a transparent optical device, according to claim 5, further comprising the step of forming a metal pattern for reflecting light on the back side.

7. The method of producing a transparent optical device according to claim 5, wherein the transparent medium is made of at least one material selected from a group consisting of synthesized silica glass, glass containing silica, crystalline quartz, sapphire and organic glass.

8. The method of producing a transparent optical device according to claim 5, wherein the at least one plasma irradiated surface portion is formed by exposing the transparent medium to accelerated ions.

9. The method of producing a transparent optical device according to claim 5, wherein the at least one plasma irradiated surface portion is formed by reactive ion etching.

10. The method of producing a transparent optical device according to claim 5, wherein the at least one plasma irradiated surface portion is formed by reactive ion etching using a gaseous plasma of a halogenized hydrocarbon.

11. The method of producing a transparent optical device according to claim 5, wherein the transparent medium is an organic glass and the at least one plasma irradiated surface portion is formed by using oxygen containing plasma.

12. The method of producing a transparent optical device according to claim 5, wherein the at least one plasma irradiated surface portion is formed by exposing the transparent medium to accelerated ions of a non-etching gas.

13. A transparent optical device, comprising:
a transparent medium which generally extends in a first plane, the transparent medium having front and back opposing sides, the front side being adapted for receiving light and the back side being adapted for emitting at least a portion of light received by the front side, the back side including at least one plasma irradiated surface portion generally extending parallel to the first plane, substantially the entire surface area of the back side generally extending parallel to the first plane being plasma irradiated, wherein at least the back side is porous.

14. The transparent optical device according to claim 13, wherein the at least one plasma irradiated surface portion of the back side has first and second surface portions, the first surface portion being recessed below the second surface portion.

15. The transparent optical device according to claim 14, wherein the difference in depth between the first surface portion and the second surface portion is an odd multiple of half a wavelength of the light to which the front surface is adapted for receiving.

16. The transparent optical device according to claim 14, further comprising a metal pattern for reflecting light formed on the back side, wherein the front side of the transparent medium has a plasma irradiated surface portion.

17. A method of producing a transparent optical device, comprising:
(a) providing a transparent medium which generally extends in a first plane, the transparent medium having front and back opposing sides, the front side being adapted for receiving light and the back side being adapted for emitting at least a portion of light received by the front side; and
(b) forming at least one plasma irradiated surface portion generally extending parallel to the first plane, substantially the entire surface area of the back side generally extending parallel to the first plane being plasma irradiated, wherein at least the back side is porous.

18. The method of producing a transparent optical device according to claim 17, wherein the at least one plasma irradiated surface portion has first and second surface portions, step (b) comprising:
(b1) forming a recessed area as the first surface portion so that the first surface portion is recessed below the second surface portion; and
(b2) plasma irradiating the back side.

19. The method of producing a transparent optical device, according to claim 18, wherein substep (b1) is completed before substep (b2).

20. The method of producing a transparent optical device according to claim 18, wherein substep (b1) comprises:
placing the transparent medium in a dry etching chamber;
dry etching the back side of the transparent medium where the recessed area is to be formed;
illuminating the back side of the transparent medium by a beam of light;
measuring the transmissivity of the transparent medium where the recessed area is to be formed; and
halting dry etching when the etching depth reaches an odd multiple of half a wavelength of the light.

21. The method of producing a transparent optical device according to claim 20, wherein the beam of light has a wavelength shorter than 300 nm.

22. The method of producing a transparent optical device according to claim 21, wherein the beam of light is emitted by a light source selected from a group consisting of gaseous plasma within the dry etching chamber, a KrF laser, an ArF laser, a carbon arc, a xenon lamp and a mercury lamp.

23. A transparent optical device, comprising:
a transparent medium having first and second regions, both the first region and the second region being adapted for bilaterally transmitting light, such that light received by the first region is emitted from the second region and light received by the second region is emitted from the first region, substantially the entire surface area of both the first region and second region being plasma irradiated, wherein at least one of the first region and the second region is porous.

24. A phase-shift photomask comprising:
a transparent substrate having opposed front and back surfaces, the back surface having first and second regions thereon;
a shifter pattern formed on the first region of the back surface of the transparent substrate; and
a main pattern formed on the second region of the back surface of the transparent substrate, the main pattern being recessed from the shifter pattern in the depth direction of the transparent substrate, wherein the difference between the main and shifter patterns in optical length of light transmitted from the front surface to the back surface is an odd multiple of half a wavelength of the light,
wherein at least the entire area of the front surface of the transparent substrate is porousized by plasma irradiation.

25. A phase-shift photomask according to claim 24, wherein the entire area of the front surface and at least one of the first and second regions of the back surface of the transparent substrate are porousized by plasma irradiation.

26. A phase-shift photomask according to claim 24, wherein the shifter pattern is recessed from the rest of the first region of the back surface in the depth direction of the transparent substrate.

27. A phase-shift photomask according to claim 24, wherein a chromium pattern is formed on a portion of the first region of the back surface of the transparent substrate, the portion of the fist region excluding the shifter pattern from the first region.

28. A phase-shift photomask comprising:
a transparent substrate having opposed front and back surfaces, the back surface having first and second regions thereon;

a shifter pattern formed on the first region of the back surface of the transparent substrate; and a main pattern formed on the second region of the back surface of the transparent substrate, the main pattern being recessed from the shifter pattern in the depth direction of the transparent substrate, wherein the difference between the main and shifter patterns in optical length of light transmitted from the front surface to the back surface is an odd multiple of half a wavelength of the light, wherein only the first region of the back surface of the transparent substrate is porousized by plasma irradiation.

29. A phase-shift photomask according to claim 28, wherein the shifter pattern is recessed from the rest of the first region of the back surface in the depth direction of the transparent substrate.

30. A phase-shift photomask according to claim 28, wherein a chromium pattern is formed on a portion of the first region of the back surface of the transparent substrate, the portion of the fist region excluding the shifter pattern from the first region.

31. A method for producing a phase-shift photomask comprising:

irradiating at least one of opposed front back and surfaces of a transparent substrate by gas plasma to form a porous layer on the irradiated surface;

depositing a chromium-oxide sandwiched chromium layer on the back surface of the transparent substrate;

removing selective areas of the chromium-oxide sandwiched chromium layer to be a shifter pattern and a main pattern on the back surface of the transparent substrate by a first dry etching; and forming a groove on the back surface of the transparent substrate selectively to form the main pattern recessed from the shifter pattern in the depth direction of the transparent substrate by a second dry etching, wherein the difference between the main and shifter patterns in optical length of light transmitted from the front surface to the back surface is an odd multiple of half a wavelength of the light.

32. A method for producing a phase-shift photomask according to claim 31, further comprising:

stripping the chromium-oxide sandwiched chromium layer from the back surface of the transparent substrate; and after stripping the chromium-oxide sandwiched chromium layer, irradiating the opposed entire front and back surfaces of a transparent substrate by gas plasma to form a porous layer on each of the irradiated surfaces.

* * * * *